(12) United States Patent
Yamada

(10) Patent No.: US 6,642,997 B2
(45) Date of Patent: Nov. 4, 2003

(54) SUBSTRATE CONVEYING SYSTEM IN EXPOSURE APPARATUS

(75) Inventor: Kohei Yamada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/887,034

(22) Filed: Jun. 25, 2001

(65) Prior Publication Data

US 2002/0021435 A1 Feb. 21, 2002

(30) Foreign Application Priority Data

Jun. 26, 2000 (JP) ........................ 2000-191048

(51) Int. Cl.[7] ................. G03B 27/62; G03B 27/42; G65G 49/07
(52) U.S. Cl. ............... 355/75; 355/53; 414/935; 414/940
(58) Field of Search ............... 355/53, 72, 75; 414/935–941

(56) References Cited

U.S. PATENT DOCUMENTS

| | | | | |
|---|---|---|---|---|
| 4,803,373 A | * | 2/1989 | Imamura et al. | 250/222.1 |
| 5,133,635 A | * | 7/1992 | Malin et al. | 294/104 |
| 5,980,187 A | * | 11/1999 | Verhovsky | 294/103.1 |
| 6,043,502 A | * | 3/2000 | Ahn | 250/559.37 |
| 6,385,497 B1 | * | 5/2002 | Ogushi et al. | 700/109 |

* cited by examiner

Primary Examiner—Rodney Fuller
Assistant Examiner—D. Ben Esplin
(74) Attorney, Agent, or Firm—Fitzpatrick, Cella, Harper & Scinto

(57) ABSTRACT

A substrate conveying system for conveying a substrate contained in an accommodating container having a supporting member for supporting the substrate. The system includes a hand for holding the substrate, a driving mechanism for moving the hand toward and away from the container, along a direction approximately parallel to the surface of the substrate, the driving mechanism being operable to move the hand to below the substrate, an elevation mechanism for moving the hand relative to the container, along a direction approximately perpendicular to the surface of the substrate, the elevation mechanism being operable to move the hand upwardly relative to the supporting member, for transfer of the substrate from the supporting member to the hand, and an obstacle detecting system for detecting the presence/absence of an obstacle within a movement range of the hand defined by the driving mechanism. The obstacle detecting system is movable in the movement direction of the hand defined by the elevation mechanism, and is operable also to detect the presence/absence of an obstacle within a movement range of the hand defined by the elevation mechanism.

8 Claims, 10 Drawing Sheets

URL http://www.maintain.co.jp./db/input.html

TROUBLE DB INPUT WINDOW

DATE  2000/3/15  ~404
MACHINE  * * * * * * * *  ~401
FILE  OPE. FAILURE (STARTING ERROR)  ~403
S. N. S/N  465NS4580001  ~402
EMERGENCY  D  ~405
STATE  LED FLICKERING AFTER POWERED  ~406
SOLUTION  RESTART:PRESS RED BUTTON  ~407
PROGRESS  TEMPORARY SOLUTION DONE  ~408

[NEXT] [RESET]  ~410          ~411          ~412
LINK TO RESULT         SOFTWARE        OPERATION
LIST DATABASE          LIBRARY         GUIDE

FIG. 8

SUBSTRATE CONVEYING SYSTEM IN EXPOSURE APPARATUS

FIELD OF THE INVENTION AND RELATED ART

This invention relates to a substrate conveying system for conveying a substrate such as a semiconductor wafer or a reticle, for example.

A lithographic process in semiconductor manufacture uses an exposure apparatus for printing, by projection exposure, a circuit original formed on a reticle onto a photoresist applied to a wafer. When a reticle is to be supplied into or collected out of such an exposure apparatus, a reticle while being accommodated in a container such as shown in FIG. 11 is introduced into the exposure apparatus. Alternatively, a container is loaded on a load port, provided on the exposure apparatus, and only a reticle inside the container is introduced into the exposure apparatus.

The structure of the container (FIG. 11) will now be described. FIG. 11 is a perspective view of a substrate (reticle) accommodating container in a separated state. The container comprises a supporting member 2a for supporting a reticle 1 having a pellicle 1a attached to the bottom face thereof, a lower tray 2 having a positioning member 2b, for roughly positioning the reticle 1 within a horizontal plane, an upper lid 3 for covering the reticle 1, and engaging means pivotably mounted on the upper lid 3 and engageable with the lower tray 2 to bring the lower tray 2 and the upper lid 3 into an integral structure. Inside the upper lid 3, there is a reticle pressing member 3a for preventing floating of the reticle 1 away from the reticle supporting member 2a on the lower tray 2, as the lower tray 2 and the upper lid 3 are brought into engagement with each other by the engaging means 4.

Between the reticle supporting member 2a and the reticle positioning member 2b of the lower tray 2, there is a space maintained to accept insertion of a fork-like hand for holding the reticle 1 by attraction. The substrate conveying system operates to relatively move this fork-like hand forwardly/backwardly and upwardly/downwardly to transfer and convey a substrate such as a reticle.

Usually, the components of such a substrate (reticle) accommodating container are made by integral molding of a resin material, because of the cost. Additionally, since it is disposed between the fork-like hand and the pellicle frame, the thickness is small. Therefore, after it is used for a long term, deformation or breakage may occur due to an internal strain produced at the time of the molding or to the handling thereof, and the space for insertion of the fork-like hand may not be assured. On that occasion, if the fork-like hand is inserted into the container, it may interfere with supporting components or positioning components, to cause breakage of the reticle or the hand itself. This requires expensive repairs or it causes increased down-time of the machine.

SUMMARY OF THE INVENTION

It is an object of the present invention to provide a substrate conveying system by which unwanted interference is prevented with a substrate accommodating container or a reticle where the reticle is to be inserted into or taken out of the container, and which is inexpensive and small in the throughput decrease.

In accordance with an aspect of the present invention, there is provided a substrate conveying system for conveying a substrate to and from an accommodating container having a supporting member for supporting one or more substrates, by use of a hand arranged to hold the substrate by attraction, characterized by an obstacle detector for detecting the presence/absence of an obstacle in a region through which said hand is inserted into said container.

In one preferred form of this aspect of the present invention, the container has a positioning member for positioning the substrate.

The positioning member may function to position the substrate in a horizontal plane.

The presence/absence of an obstacle may be detected at the time of transfer of the substrate.

The conveying system may further comprise a transmission type sensor having an optical axis approximately parallel to the movement direction of said hand and extending between a region in which the supporting member should be placed and a region into which the hand should be inserted, wherein said sensor is relatively moved upwardly or downwardly relative to said supporting member, whereby an obstacle can be detected.

The container may comprise a lower tray unit including a lower tray having said supporting member and said positioning member, an upper lid unit including an upper lid for covering the substrate, and an engaging member pivotably supported by said upper lid and for disengageably engaging said lower tray and said upper lid with each other, wherein said substrate conveying system includes a lower-tray supporting table for supporting and positioning said lower tray of said container, upper-lid holding means for holding said upper lid of said container, and container opening and closing means for releasing said engaging member and for relatively moving said lower-tray supporting table and said upper-lid holding means upwardly or downwardly, and wherein said transmission type sensor is fixedly mounted on said upper-lid holding means.

The obstacle detector may be operable to detect deformation or breakage of said container.

The detection of an obstacle may be performed simultaneously with mapping of the substrate.

The mapping of the substrate may be performed by using the whole of or one of an output of said obstacle detector.

The conveying system may further comprise memory means for storing an output of said obstacle detector, together with the amount of upward or downward motion of said upper-lid holding means.

In accordance with another aspect of the present invention, there is provided an exposure apparatus including a substrate conveying system as recited above.

In accordance with a further aspect of the present invention, there is provided a group of production machines, for performing various processes.

The method may further comprise (i) connecting the production machines of the group with each other through a local area network, and (ii) executing data-communication concerning information related to at least one production machine of the production machine group, between the local area network and an external network outside the semiconductor manufacturing factory.

A database provided by a vendor or a user of the exposure apparatus may be accessed through the external network so that maintenance information related to the production machine can be obtained through the data communication, and wherein production control can be performed on the basis of data communication made through the external network and between the semiconductor factory and a separate semiconductor factory.

In accordance with yet a further aspect of the present invention, there is provided a semiconductor manufacturing factory, comprising: a group of production machines, for performing various processes, including an exposure apparatus as recited above; a local area network for connecting the production machines of the production machine group with each other; and a gateway for enabling an access from the local area network to an external network outside the factory, wherein information related to at least one production machine in the group can be data communicated by use of the local area network and the gateway.

In accordance with a still further aspect of the present invention, there is provided a method of executing maintenance of an exposure apparatus, as recited above and being provided in a semiconductor manufacturing factory, said method comprising the steps of: preparing, by a vendor or a user of the exposure apparatus, a maintenance database connected to an external network outside the semiconductor manufacturing factory; admitting an access from the semiconductor manufacturing factory to the maintenance database through the external network; and transmitting maintenance information stored in the maintenance database to the semiconductor manufacturing factory through the external network.

The exposure apparatus as described above may comprise a display, a network interface and a computer for executing network software, wherein maintenance information related to said exposure apparatus is data communicated through the computer network.

In the exposure apparatus, the network software may provide on the display a user interface for accessing a maintenance database prepared by a vendor or a user of said exposure apparatus and connected to an external network outside a factory where said exposure apparatus is placed, thereby to enable obtaining information from the database through the external network.

The substrate conveying system as described above may further be characterized by a transmission type sensor having an optical axis approximately parallel to the movement direction of said hand and extending between a region in which the positioning member should be placed and a region into which the hand should be inserted, wherein said sensor is relatively moved upwardly or downwardly relative to said positioning member, whereby an obstacle can be detected.

In the structure described above, there is an obstacle detector for detecting the presence/absence of an obstacle in a region into which a hand is to be inserted. If any obstacle is detected, the insertion of the hand is discontinued, such that interference of the hand with the substrate accommodating container can be avoided beforehand.

A transmission type sensor has an optical axis and extends approximately parallel to the movement direction of the hand and extends between a region through which the hand should be inserted into the container and a region in which the substrate supporting member or substrate positioning member of the container should be inherently placed. This sensor may be mounted on an upper-lid holding means to detect an obstacle during the opening/closing motion of the upper lid. Therefore, a decrease of the throughput can be suppressed sufficiently.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are graphs, respectively, showing sensor outputs P and upward/downward motion amounts Z, in an embodiment of the present invention, wherein FIG. 4A is a case where a reticle is accommodated in a normal container, whereas FIG. 4B is a case in which the supporting member is deformed into a hand receiving region.

FIG. 8 is a schematic view for explaining an example of a user interface.

DESCRIPTION OF THE PREFERRED EMBODIMENTS

Preferred embodiments of the present invention will now be described with reference to the accompanying drawings.
[Embodiment of Substrate Conveying System]

Figure 1:
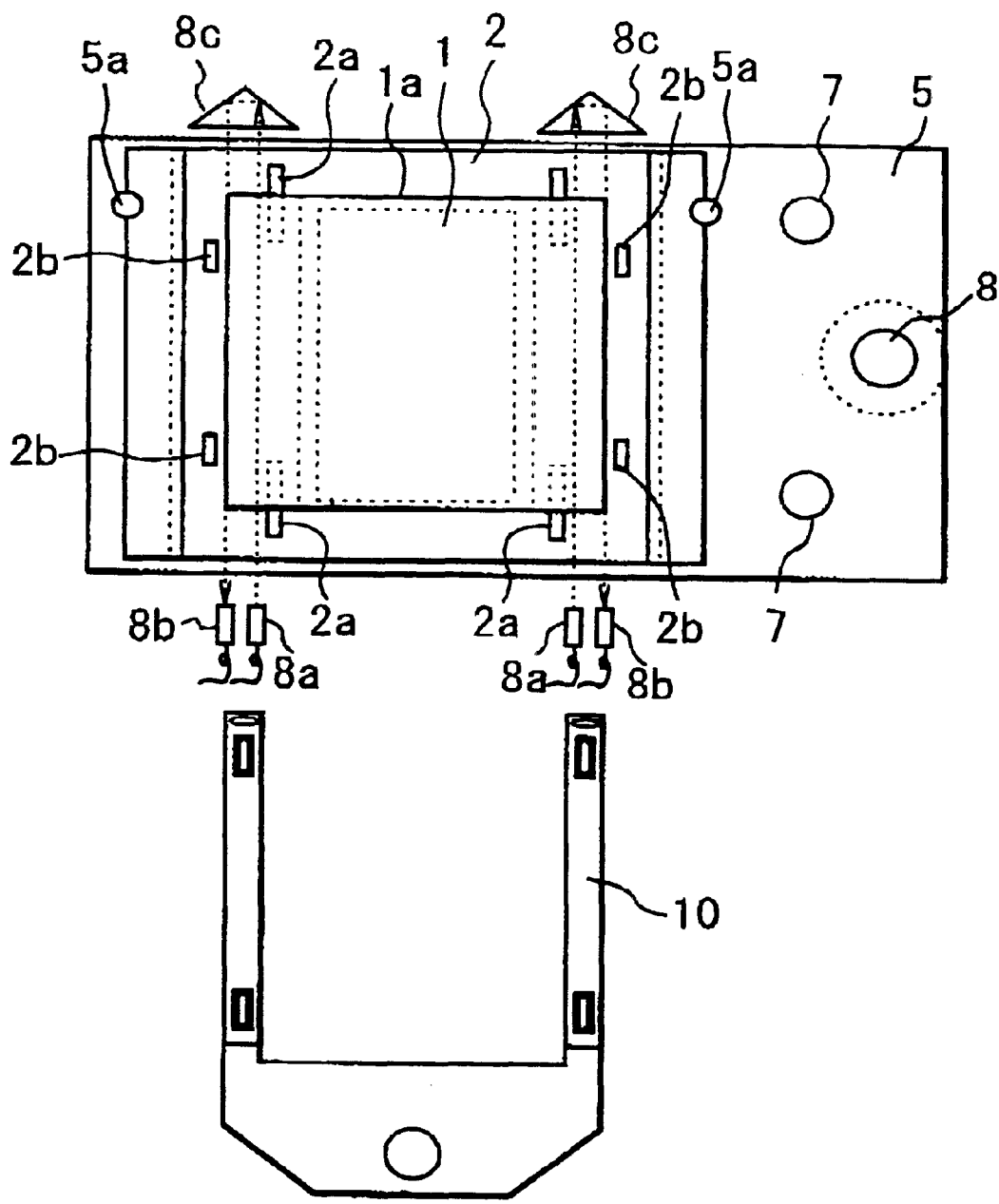
FIG. 1 is a plan view of a substrate conveying system according to an embodiment of the present invention.
Figure 2:
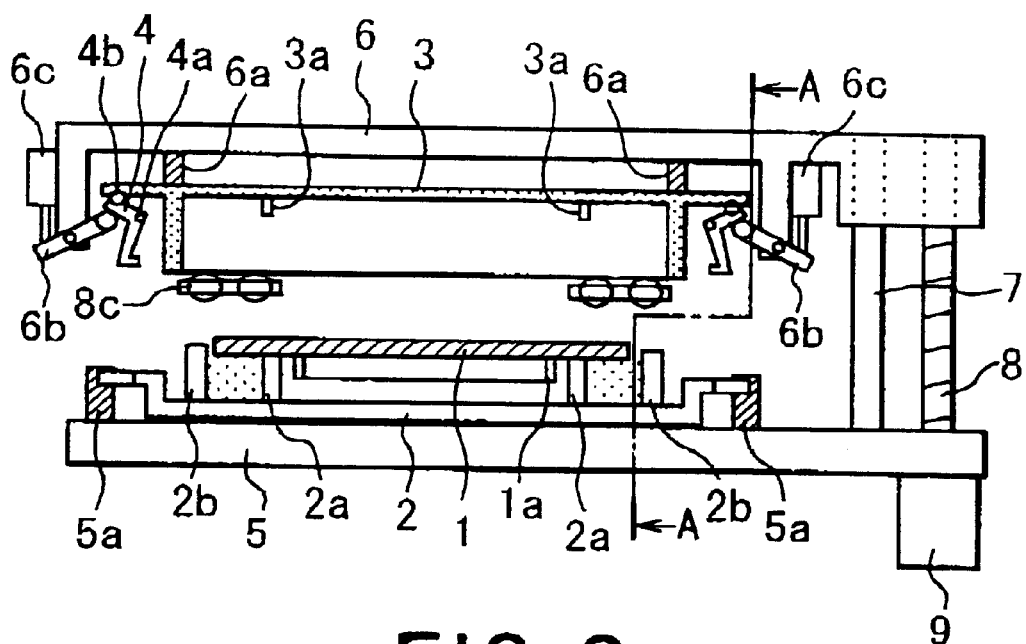
FIG. 2 is a front view of a substrate conveying system according to an embodiment of the present invention.
Figure 3:
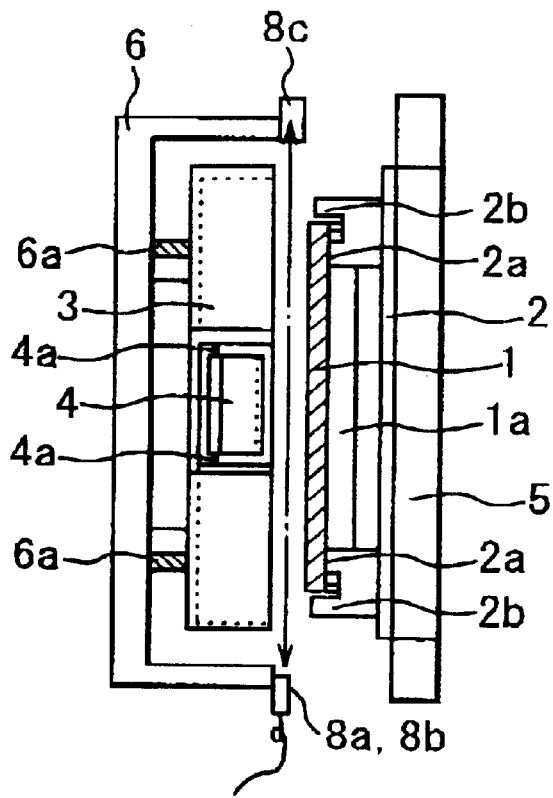
FIG. 3 is a sectional view of a substrate conveying system according to an embodiment of the present invention.

FIG. 1 is a plan view of a substrate conveying system according to an embodiment of the present invention. FIG. 2 is a front view of the substrate conveying system of this embodiment, and FIG. 3 is a sectional view of the same. A description will be made with reference to FIGS. 1, 2 and 3.

A reticle 1 has a pellicle 1a adhered to the bottom face thereof, and the reticle 1 is placed on supporting members 2a which constitute a lower-tray table for a lower tray 2, included in a lower-tray unit of the container. The reticle is held in a space defined between an upper lid 3, included in an upper tray unit of the container, and the lower tray 2, while being roughly positioned by positioning members 2b. The lower tray 2 and the upper lid 3 are engaged with each other into an integral structure, by means of an engaging member 4 pivotably supported by a shaft 4a at the side face of the upper lid 3. However, they can be separated from each other. The engaging member 4 is biased by a spring member 4b so as to prevent disengagement thereof due to a reaction force produced by pressing members 3a, being protruded from the upper lid 3 and pressing the reticle 1.

The mechanism for loading the container, having a reticle 1 accommodated therein and for separating the upper lid 3 and the lower tray 2 from each other, comprises guide pins 5a for positioning the lower tray 2 upon a base 5, a sensor (not shown) for detecting the presence/absence of the container upon the base 5, a guide shaft 7 for movably supporting an 6k upper-lid holding member (upper-lid holding means) 6 for holding the upper lid 3, for upward and downward motion, and a feed screw 8 and a motor 9 engageable with the upper-lid holding member 6 and being movable upwardly and downwardly. These components are fixed or pivotably mounted, and they constitute container opening/closing means.

On the other hand, mounted on the upper-lid holding member 6 are pressing members 6a for pressing down the upper lid 3, releasing levers 6b for releasing the engaging member 4 pivotably supported by the upper-lid holding member 6, and cylinders 6c for pivotally rotating the releasing levers 6b. Additionally, in the advancement direction of the fork-like hand 10 for moving a reticle 1 into and out of the container, there are a light projecting unit 8a and a light receiving unit 8b of two pairs of transmission type photosensors (transmission type sensors). Also, there are reflection members 8c fixed (secured) on the opposite side of the container, for reflecting light from the light projecting unit Sa back to the light receiving unit 8b. Here, the light emitted from the light projecting unit 8a advances between a region where the supporting members 2a should inherently be placed and a region in which the fork-like hand is going to access. After being reflected by the reflection member Sc, the light goes between the hand accessing region and the region where the positioning members 2b should inherently be placed, and then the light is incident on the light receiving unit 8b. On the basis of the output of this sensor, the presence/absence of any obstacle within the hand accession region can be detected. In this embodiment, the light projecting unit 8a, the light receiving unit 8b and the reflection members 8c constitute an obstacle detector.

Next, detection of an obstacle in the hand accessing region will be explained. First, a reticle accommodating container having a reticle 1 accommodated therein is placed on the base 5. Then, the feed screw 8 is rotated by the motor 9. The upper lid holding member 6 is moved down by the pressing member 6a, until a small clearance between the upper lid 3 and the lower tray 2 is removed. Subsequently, the releasing lever 6b is rotated by the cylinder 6c, whereby the engagement between the lower tray 2 and the engaging member 4 is released. Also, the upper lid 3 is held by the upper-lid holding member 6. The motor 9 is then rotated reversely, and the upper-lid holding member 6 is moved upward, together with the upper lid 3. At this time, the outputs P of the two pairs of transmission type photosensors are memorized in relation to the amount Z of upward/downward motion of the upper-lid holding member 6. If the Z coordinates of the light blocking region overlay the accessing region of the fork-like hand 10, the insertion of the hand 10 is discontinued. By means of an error signal, the abnormality is informed to an operator. Further, from the memorized information (by using all of or a portion of the output of the obstacle detector), the height of the reticle 1 is measured. Based on this, whether the reticle is being accommodated regularly or not is detected (at the same time). Namely, the mapping can be done.

Figure 4A:
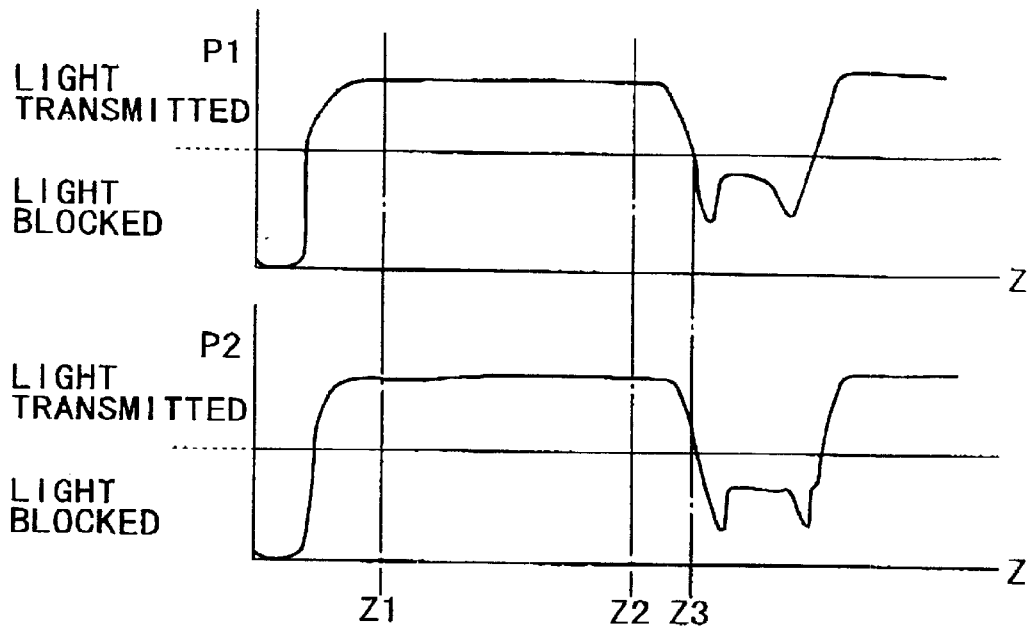
Figure 4B:
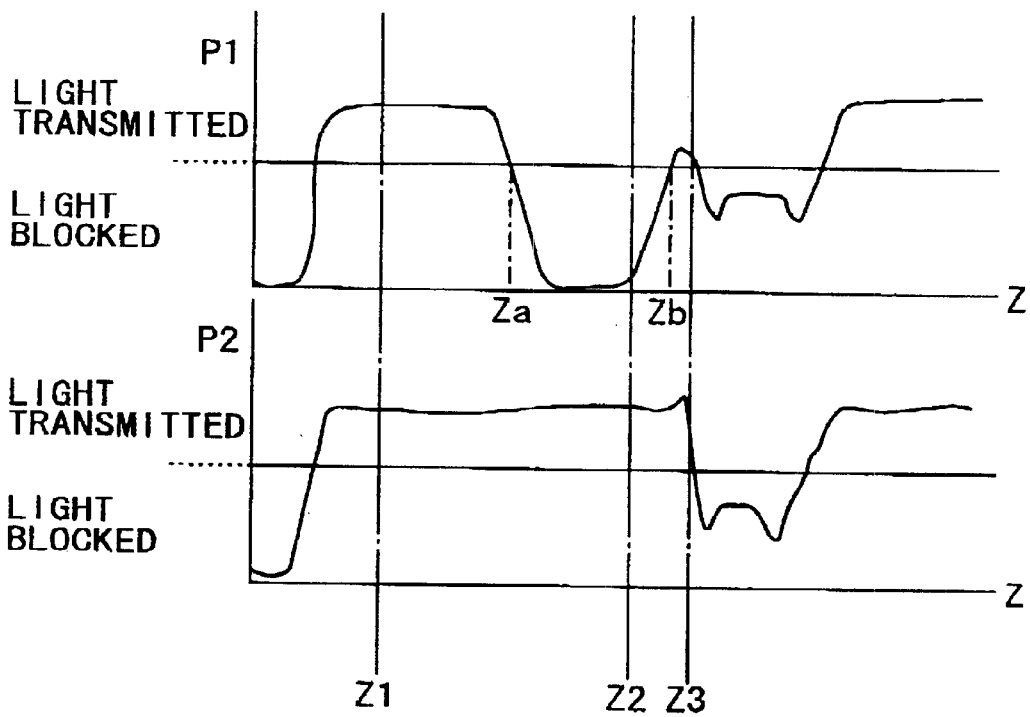

FIG. 4A is a graph showing outputs P1 and P2 of two pairs of transmission type sensors and the amount Z of upward/downward motion, in a case where a reticle is accommodated in a normal container. FIG. 4B is a graph showing outputs P1 and P2 of two pairs of light transmission type sensors in a case where the supporting member 2a is deformed to enter into the hand accessing region. If the Z coordinate of the hand accessing region is denoted by Z1–Z2 and the Z coordinate of the reticle 1 is denoted by Z3, it is seen that in FIG. 4B the light blocking regions Za–Zb partially overlap with Z1–Z2 and that there occurs interference with the fork-like hand 10 when the same is inserted.

[Embodiment of Exposure Apparatus]

Figure 5:
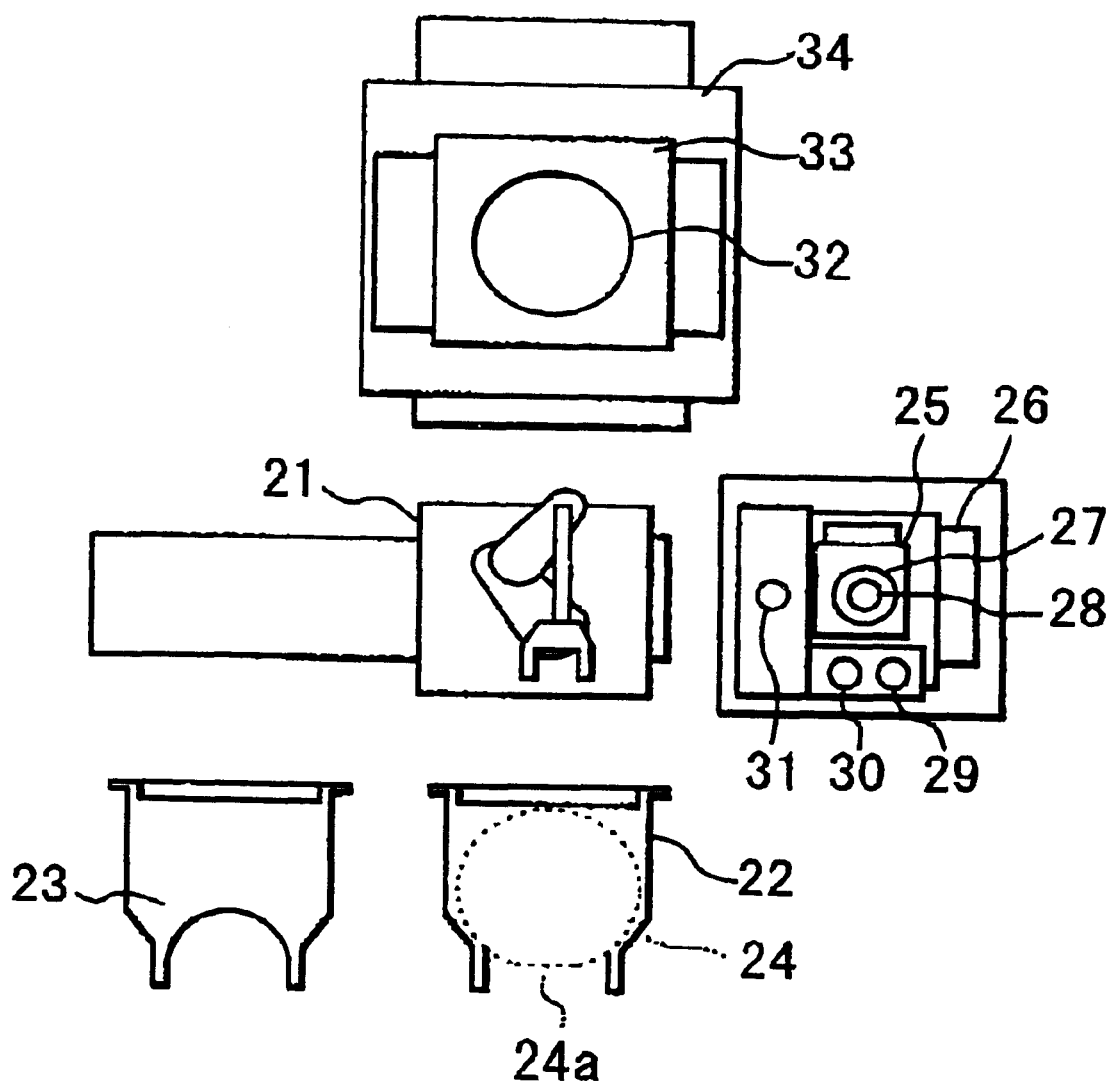
FIG. 5 is a schematic view of a main portion of an exposure apparatus having a substrate conveying system according to an embodiment of the present invention.

FIG. 5 is a schematic view of a main portion of an exposure apparatus having a substrate conveying system according to an embodiment of the present invention.

In semiconductor exposure apparatuses such as a stepper, for example, plural substrates 24 (hereinafter, wafers) are accommodated in a carrier 22 and, by using a conveyance robot 21, these wafers 24 are taken out sequentially. The wafer is then loaded on a mechanical prealignment (PA) station. At the PA station, the positioning with respect to an orientation flat 24a is carried out. As for this positioning, after the wafer 24 is held by a PA chuck 28, the wafer 24 is rotated by a PA θ stage 27 and, during the rotation, the position of an edge of the wafer 24 is detected by a PA optical system 29–31. Thus, the position of the orientation flat 24a as well as the eccentric amount of the wafer 24 are calculated. Then, by means of a PA X stage 25, a PA Y stage 26 and a PA θ stage 27, the wafer is exactly placed at a predetermined position. This operation is called an orientation flat detecting operation. Thereafter, the wafer 24 is held by substrate holding means (hand), not shown, and it is conveyed onto a wafer chuck 32 at the exposure station. After this, by using an X stage 33 and a Y stage 34, the stepwise motion is carried out and exposures are executed. Also, after the exposure, the wafer 24 is unloaded out of the wafer chuck 32 by the conveyance robot 21, and it is collected into a carrier 23.

Here, as regards the carrier for accommodating plural substrates therein, an open type carrier which is loaded on a machine while the carrier is not placed in a clean box, or mini-environment pod type carrier which is loaded on a machine while the carrier is accommodated in a clean box, that is, for example, an SMIF (Standard Mechanical Interface) pod type, may be used. As an example, an open carrier may be used mainly in a relatively clean and good environment, whereas an SMIF pod may be used if the carrier moves through a process having poor cleanness, to prevent adhesion of particles to the carrier and the substrate. Also, an AGV (carrier conveyance robot) may be used so as to load the carrier in the apparatus automatically, it is to be noted that, while in this embodiment the substrate 24 is called a wafer, it may be a reticle, and it is not limited to a wafer.

[Embodiment of Semiconductor Manufacturing System]

Next, an embodiment of a manufacturing system for manufacturing semiconductor devices such as semiconductor chips (e.g., ICs or LSIs), liquid crystal panels, CCDs, thin film magnetic heads, or micro-machines, for example, will be described. This system is arranged so that the repair of any disorder occurring in a production machine placed in a semiconductor manufacturing factory or periodic maintenance thereof or, alternatively, a maintenance service such as software supply, can be made by use of a computer network outside the manufacturing factory.

Figure 6:
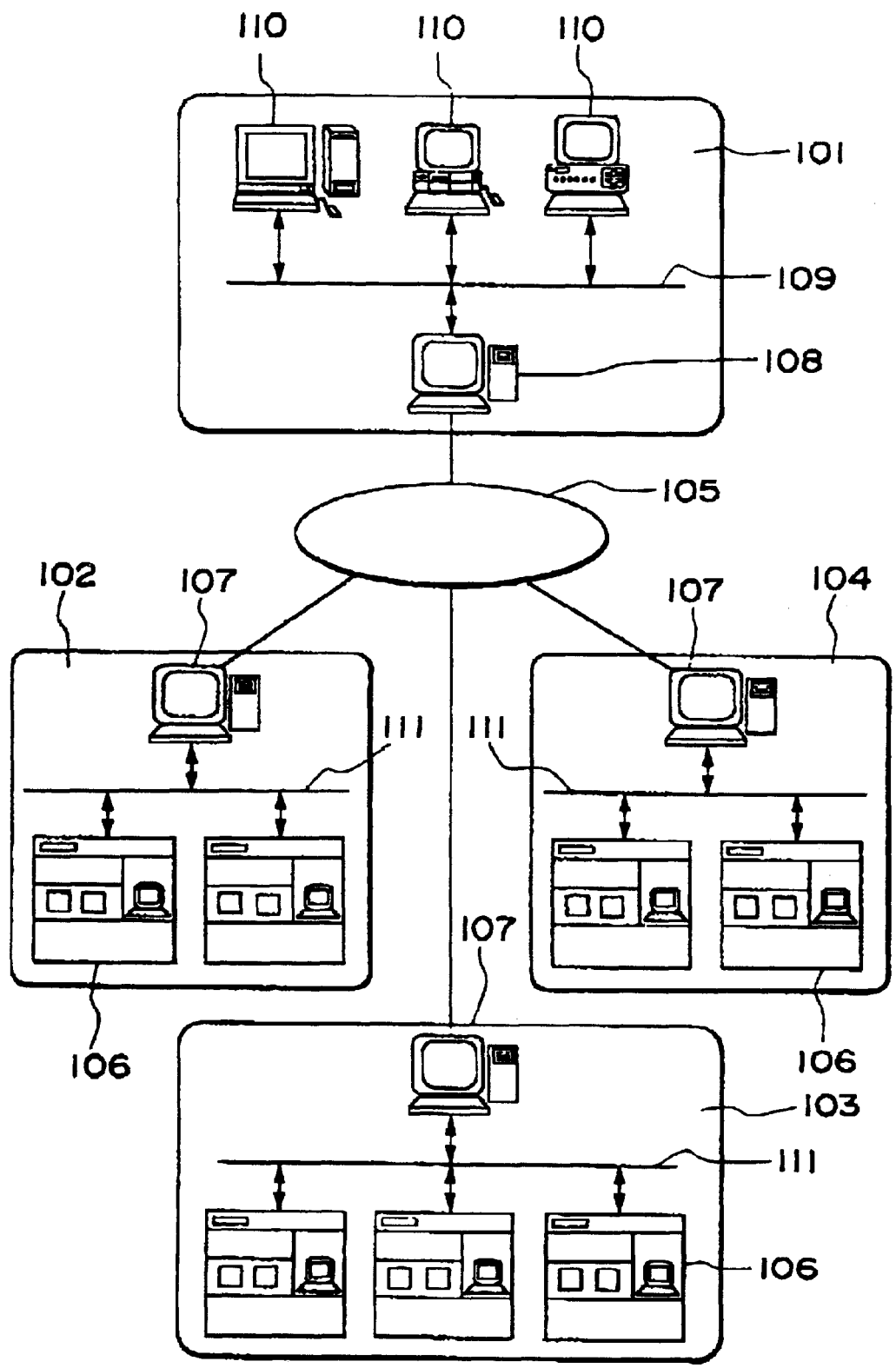
FIG. 6 is a schematic view of a semiconductor device manufacturing system, as viewed in a certain aspect thereof.

FIG. 6 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (e.g., various lithographic apparatuses such as an exposure apparatus, for example, a coating apparatus, an etching apparatus, for example, as well as a heat treatment apparatus, a film forming apparatus, and a flattening apparatus) and post-process machines (e.g., an assembling machine and an inspection machine, for example) are assumed. Inside the business office 101, there are a host control system 108 for providing a maintenance database for the production machines, plural operating terminal computers 110, and a local area network (LAN) 109 for connecting them to constitute and intranet. The host control system 108 is provided with a gateway for connecting the LAN 109 to an internet 105, which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105, which is an outside network of the factory. With this structure, the host control system 108 of the vendor 101 can be accessed from the LAN 111 in each factory, through the internet 105. Further, due to the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, any response information, which is responsive to the notice (that is, for example, information on how the disorder should be treated or software data concerning the treatment) as well as a latest software program and maintenance information such as help information, may be supplied from the vendor. The data communicated between each factory 102–104 and the vendor 101 as well as the data communication through the LAN 111 in each factory, may use a communication protocol (TCP/IP) generally used in the internet. In place of using the internet, an exclusive line network (e.g., ISDN), controlled with a strictest security that access of a third party is not allowed, may be used. Further, the host control system is not limited to the system as provided by the vendor. A database may be structured by the user and it may be set in an outside network, such that it can be accessed from plural user factories.

Figure 7:
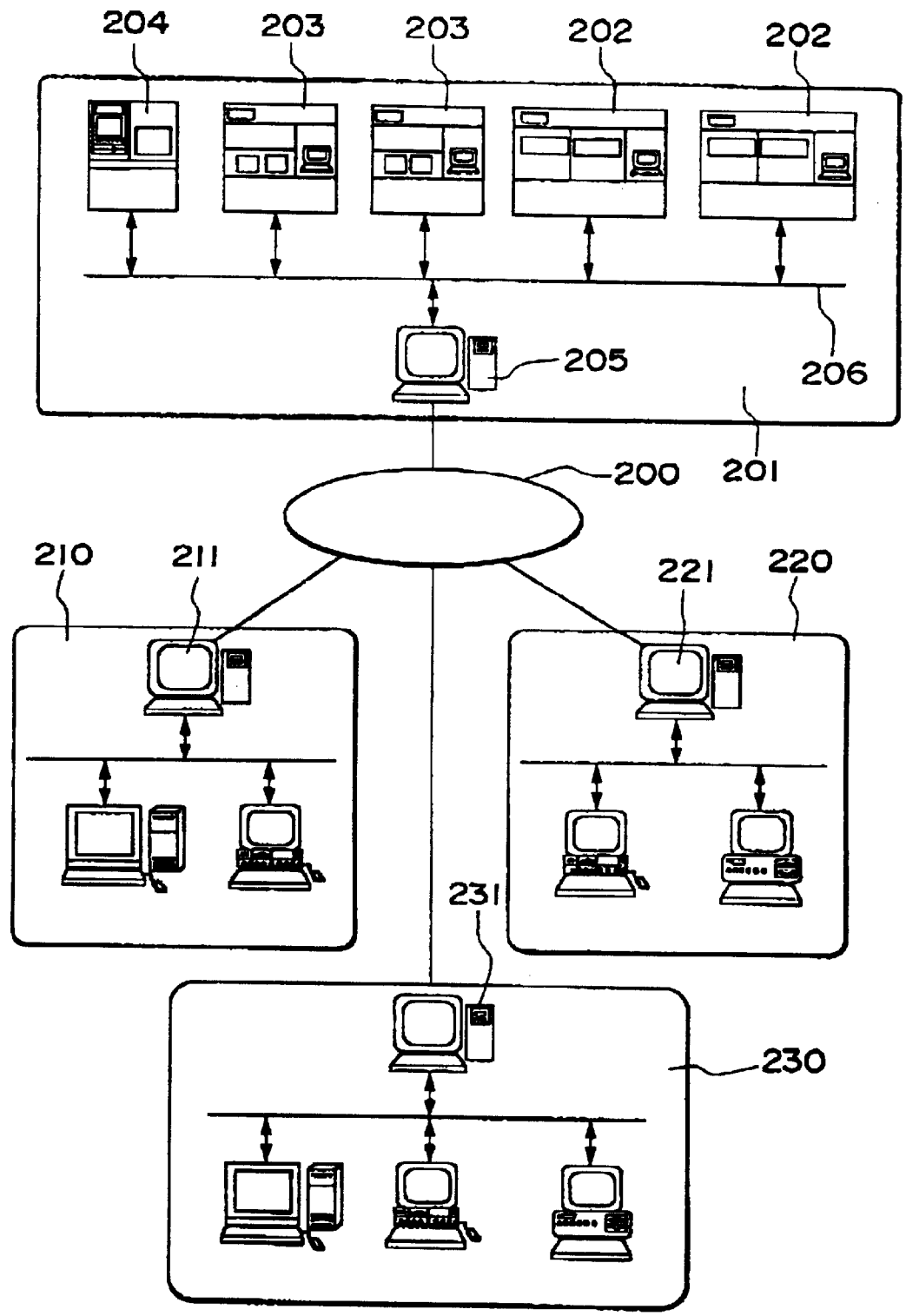
FIG. 7 is a schematic view of a semiconductor device manufacturing system, as viewed in another aspect thereof.

FIG. 7 is a schematic view of a general structure of the production system according to this embodiment, in another aspect thereof, different from that of FIG. 6. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 8, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version software to be used for the production machine, from the software library as provided by the vendor. Alternatively, the operator can get an operation guide (help information) prepared for factory operators.

Next, a semiconductor device manufacturing process which uses the production system described above, will be explained.

Figure 9:
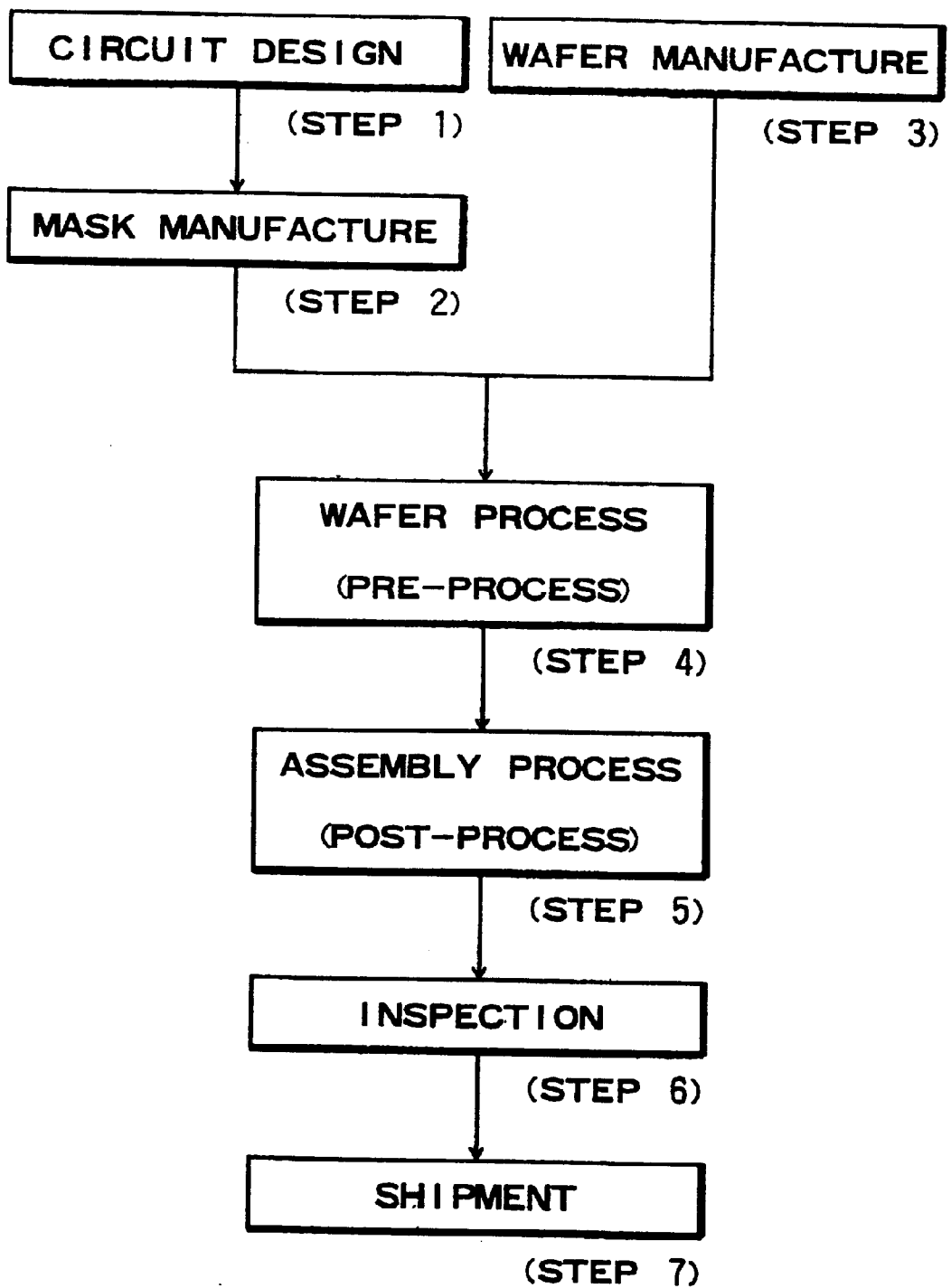
FIG. 9 is a flow chart for explaining device manufacturing processes.

FIG. 9 is a flow chart of a general procedure for the maintenance of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5 are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 10:
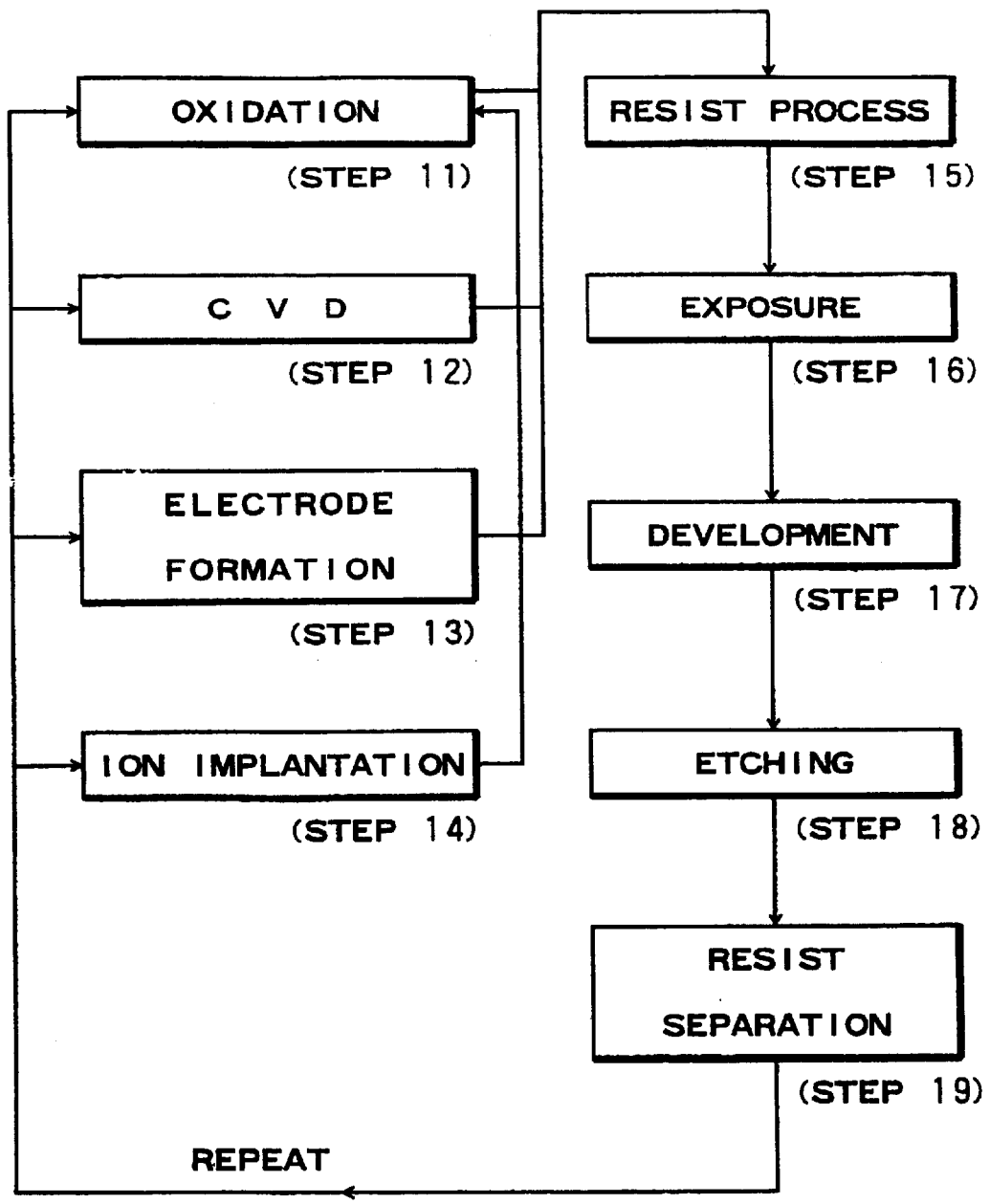
FIG. 10 is a flow chart for explaining details of a wafer process in the procedure of the flow chart of FIG. 9.
Figure 11:
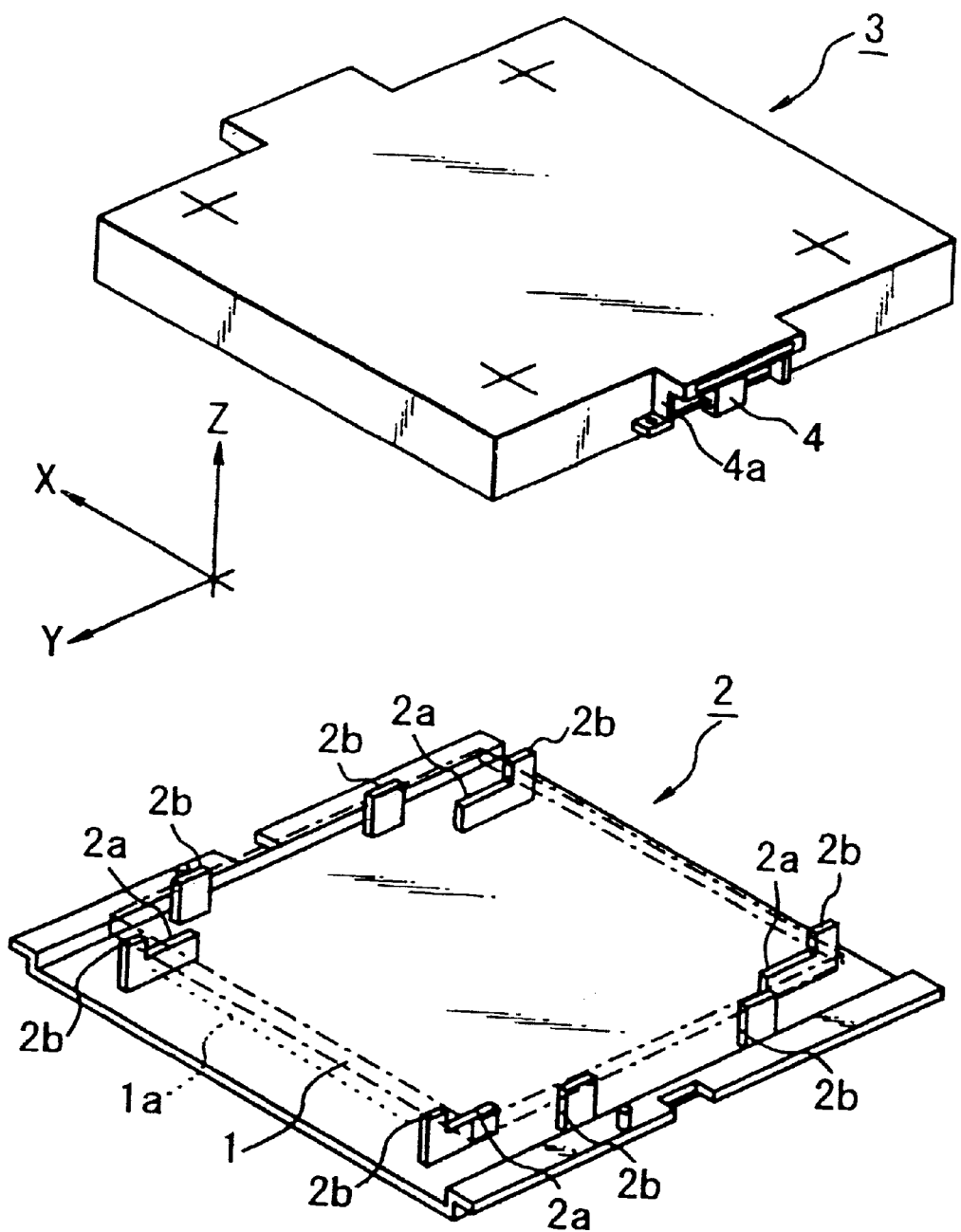
FIG. 11 is a perspective view of a substrate (reticle) accommodating container in a separated state.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the present invention, as described hereinbefore, an obstacle detector for detecting the presence/absence of an obstacle in the hand accessing region is used. If any obstacle is detected, insertion of the hand is discontinued. Therefore, interference of the hand with the substrate container can be avoided beforehand.

Further, a transmission type sensor, having an optical axis and extending approximately parallel to the movement direction of the hand and extending between a region through which the hand, is inserted into the container in a region in which the substrate supporting member or substrate positioning member of the container should be inherently placed. This sensor may be mounted on an upper-lid holding means to detect an obstacle during the opening/closing motion the upper lid. As a result, a decrease of the throughput can be suppressed sufficiently.

Furthermore, with an obstacle detector of the present invention, an inexpensive substrate conveying system, which provides the advantageous effects described above, is accomplished without changing the material of the substrate container.

While the invention has been described with reference to the structures disclosed herein, it is not confined to the details set forth and this application is intended to cover such modifications or changes as may come within the purposes of the improvements or the scope of the following claims.

What is claimed is:

1. A substrate conveying system for conveying a substrate contained in an accommodating container which includes (i) a lower tray having a supporting member for supporting the substrate and (ii) an upper lid being engageable with the lower tray and for covering above the substrate, said substrate conveying system comprising:

an upper lid opening/closing mechanism for moving the upper lid relative to the lower tray, along a direction approximately perpendicular to the surface of the substrate, said upper lid opening/closing mechanism being operable to relatively move the upper lid to disengage the upper lid from the lower tray and to move the upper lid upwardly;

a hand for holding the substrate;

a driving mechanism for moving said hand toward and away from the lower tray, along a direction approximately parallel to the surface of the substrate, said driving mechanism being operable to move the hand to below the substrate;

an elevation mechanism for moving the hand relative to the lower tray, in a direction approximately perpendicular to the surface of the substrate, said elevation mechanism being operable to move the hand upwardly relative to the supporting member, for transfer of the substrate from the supporting member to the hand; and an obstacle detecting system for detecting the presence/absence of an obstacle within a movement range of the hand defined by said driving mechanism, wherein said obstacle detecting system is provided in said upper lid opening/closing mechanism and is operable also to detect the presence/absence of an obstacle within a movement range of the hand defined by said elevation mechanism.

2. A substrate conveying system for conveying a substrate contained in an accommodating container having a supporting member for supporting the substrate, said substrate conveying system comprising:

a hand for holding the substrate;

a driving mechanism for moving said hand toward and away from the container, along a direction approximately parallel to the surface of the substrate, said driving mechanism being operable to move the hand to below the substrate;

an elevation mechanism for moving the hand relative to the container, along a direction approximately perpendicular to the surface of the substrate, said elevation mechanism being operable to move the hand upwardly relative to the supporting member, for transfer of the substrate from the supporting member to the hand; and an obstacle detecting system for detecting the presence/absence of an obstacle within a movement range of the hand defined by said driving mechanism and/or said elevation mechanism, by use of a light beam having an optical axis approximately parallel to the movement direction of the hand defined by said driving mechanism, wherein the container has a positioning member for positioning the substrate within the container, and wherein said driving mechanism moves the hand from between the supporting member and the positioning member to beneath the substrate.

3. A substrate conveying system for conveying a substrate contained in an accommodating container having a supporting member for supporting the substrate, said substrate conveying system comprising:

a hand for holding the substrate;

a driving mechanism for moving said hand toward and away from the container, along a direction approximately parallel to the surface of the substrate, said driving mechanism being operable to move the hand to below the substrate;

an elevation mechanism for moving the hand relative to the container, along a direction approximately perpendicular to the surface of the substrate, said elevation mechanism being operable to move the hand upwardly relative to the supporting member, for transfer of the substrate from the supporting member to the hand; and an obstacle detecting system for detecting the presence/absence of an obstacle within a movement range of the hand defined by said driving mechanism and/or said elevation mechanism, by use of a light beam having an optical axis approximately parallel to the movement direction of the hand defined by said driving mechanism, wherein the light beam is projected from a light projecting unit and passes between the supporting member and a movement region of the hand determined by said driving mechanism and is reflected by a reflection member, and wherein the reflected light beam passes between a positioning member for positioning the substrate within the container and the movement region of the hand determined by said driving mechanism and is received by a light receiving unit.

4. A substrate conveying system for conveying a substrate contained in an accommodating container having a supporting member for supporting the substrate, said substrate conveying system comprising:

a hand for holding the substrate;

a driving mechanism for moving said hand toward and away from the container, along a direction approximately parallel to the surface of the substrate, said driving mechanism being operable to move the hand to below the substrate;

an elevation mechanism for moving the hand relative to the container, along a direction approximately perpendicular to the surface of the substrate, said elevation mechanism being operable to move the hand upwardly relative to the supporting member, for transfer of the substrate from the supporting member to the hand;

an obstacle detecting system for detecting the presence/absence of an obstacle within a movement range of the hand defined by said driving mechanism and/or said elevation mechanism, by use of a light beam having an optical axis approximately parallel to the movement direction of the hand defined by said driving mechanism; and memory means for storing an output of said obstacle detecting system in relation to an amount of upward or downward motion of said obstacle detecting system.

5. A substrate conveying system according to any one of claims 2, 3 and 4, wherein said obstacle detecting system includes a light projecting unit and a light receiving unit disposed at one side of the container, and a reflection member disposed at the other side of the container.

6. A substrate conveying system according to any one of claims 2, 3 and 4, wherein a light beam projected from said light projecting unit passes between the positioning member and a movement region of the hand determined by said driving mechanism, and is reflected by said reflection member, and wherein the reflected light beam passes between the supporting member and the movement region of the hand determined by said driving mechanism and is received by said light receiving unit.

7. A substrate conveying system according to any one of claims 2, 3 and 4, wherein said obstacle detecting system is further arranged to detect deformation of said container.

8. A substrate conveying system according to any one of claims 2, 3 and 4, wherein said obstacle detecting system is further arranged to detect whether the substrate is contained in place in said container.

* * * * *

UNITED STATES PATENT AND TRADEMARK OFFICE
CERTIFICATE OF CORRECTION

PATENT NO.    : 6,642,997 B2
DATED         : November 4, 2003
INVENTOR(S)   : Kohei Yamada It is certified that error appears in the above-identified patent and that said Letters Patent is hereby corrected as shown below:

Column 2,
Line 43, "of or one of" should read -- of or a portion of --.

Column 4,
Line 43, "pellicle la" should read -- pellicle 1a --.
Line 64, "an 6*k*" should read -- an --.

Column 5,
Line 15, "Sa back" should read -- 8*a* back --.
Line 19, "member Sc," should read -- 8*c*, --.

Column 6,
Line 36, "automatically, it" should read -- automatically. It --.

Signed and Sealed this

Twentieth Day of April, 2004

JON W. DUDAS
*Acting Director of the United States Patent and Trademark Office*